US011035919B2

(12) United States Patent
Millard et al.

(10) Patent No.: US 11,035,919 B2
(45) Date of Patent: Jun. 15, 2021

(54) IMAGE RECONSTRUCTION USING A COLORED NOISE MODEL WITH MAGNETIC RESONANCE COMPRESSED SENSING

(71) Applicant: Siemens Healthcare GmbH, Erlangen (DE)

(72) Inventors: Charles Millard, Oxford (GB); Boris Mailhe, Plainsboro, NJ (US); Mariappan S. Nadar, Plainsboro, NJ (US)

(73) Assignee: Siemens Healthcare GmbH, Erlangen (DE)

( * ) Notice: Subject to any disclaimer, the term of this patent is extended or adjusted under 35 U.S.C. 154(b) by 16 days.

(21) Appl. No.: 16/532,917

(22) Filed: Aug. 6, 2019

(65) Prior Publication Data

US 2020/0278410 A1 Sep. 3, 2020

Related U.S. Application Data

(60) Provisional application No. 62/812,274, filed on Mar. 1, 2019.

(51) Int. Cl.
*G01V 3/00* (2006.01)
*G01R 33/56* (2006.01)
*G06T 5/00* (2006.01)
*G01R 33/00* (2006.01)

(52) U.S. Cl.
CPC ..... *G01R 33/5608* (2013.01); *G01R 33/0029* (2013.01); *G06T 5/002* (2013.01)

(58) Field of Classification Search
CPC .............. G01R 33/543; G01R 33/5659; G01R 33/3415; G01R 33/36; A61B 5/055

USPC ......................................................... 324/309
See application file for complete search history.

(56) References Cited

U.S. PATENT DOCUMENTS

| 4,510,944 A * | 4/1985 | Porges ............... A61B 5/02411 600/484 |
| 4,996,871 A * | 3/1991 | Romano ............... G01F 1/8431 73/32 A |
| 9,542,761 B2 | 1/2017 | Tan |
| 2005/0019000 A1 * | 1/2005 | Lim ...................... G06T 3/4069 386/209 |

(Continued)

OTHER PUBLICATIONS

Donoho, David L., Arian Maleki, and Andrea Montanari. "Message passing algorithms for compressed sensing: I. motivation and construction." 2010 IEEE information theory workshop on information theory (ITW 2010, Cairo). IEEE, 2010.

(Continued)

*Primary Examiner* — Walter L Lindsay, Jr.
*Assistant Examiner* — Frederick Wenderoth

(57) ABSTRACT

Magnetic resonance compressed sensing data may be acquired and reconstructed into an image. Noise-like aliasing present in the compressed sensing data may be modeled. The reconstruction may include denoising the compressed sensing data based on a noise level of the compressed sensing data, a sampling density of the compressed sensing data, and the model of the noise-like aliasing. A result of the denoising is denoised image data. The reconstruction may further include generating updated image data based on the compressed sensing data and the denoised image data. An output image based on the updated image may be output.

20 Claims, 6 Drawing Sheets

(56) References Cited

U.S. PATENT DOCUMENTS

| | | | |
|---|---|---|---|
| 2013/0049752 A1* | 2/2013 | Hutter | G01R 33/5611 324/309 |
| 2016/0048950 A1* | 2/2016 | Baron | G06T 5/002 382/275 |
| 2016/0247299 A1* | 8/2016 | Tan | G06T 11/003 |

OTHER PUBLICATIONS

Rangan, Sundeep, Philip Schniter, and Alyson K. Fletcher. "Vector approximate message passing." IEEE Transactions on Information Theory (2019).

* cited by examiner

201

203

205

207

IMAGE RECONSTRUCTION USING A COLORED NOISE MODEL WITH MAGNETIC RESONANCE COMPRESSED SENSING

PRIORITY CLAIM

This application claims priority to U.S. provisional application Ser. No. 62/812,274, filed 1 Mar. 2019, which is entirely incorporated by reference.

FIELD

The following disclosure relates to reconstructing magnetic resonance compressed sensing data using a colored noise model.

BACKGROUND

In magnetic resonance (MR) imaging, images are reconstructed from k-space measurements. Because MR images are usually highly compressible in some transform domain, one can "compress" or undersample the MR measurements before reconstruction into MR images. The process of reconstructing images from fewer measurements is referred to as compressed sensing. MR compressed sensing accelerates MR scans by reducing the number of measurements needed per image.

However, because fewer measurements are present in the measurements generated by compressed sensing, noise-like aliasing artifacts may be present in reconstructed images. The aliasing artifacts due to the compressed sensing process may be removed during reconstruction using a prior model of fully sampled images and a model of the aliasing artifacts. Many reconstruction algorithms are available, each affecting the performance of the reconstruction process and the resulting image quality. For example, different reconstruction algorithms may be more or less effective at removing the aliasing artifacts from the reconstructed image.

SUMMARY

By way of introduction, the preferred embodiments described below include methods, systems, instructions, and computer readable media for reconstructing magnetic resonance compressed sensing data.

In a first aspect, a method is provided for reconstructing medical image data. The method may include acquiring compressed sensing data, determining a sampling density of the compressed sensing data and a noise level of the compressed sensing data, transforming the compressed sensing data into an estimated image that is an unbiased estimator of a true image corrupted by noise-like aliasing, determining an intensity of the noise-like aliasing, denoising the compressed sensing data based on a noise model constructed from the sampling density of the compressed sensing data, the noise level of the compressed sensing data, and the intensity of the noise-like aliasing, checking the denoised image data for consistency with the compressed sensing data, and outputting an output image as a function of the updated image data. A result of the denoising may be denoised image data. A result of the checking may be updated image data.

In a second aspect, a method is provided for image reconstruction for compressed magnetic resonance data. The method may include acquiring compressed sensing data, reconstructing the compressed sensing data into a medical image, and outputting an output image based on the updated image. The reconstructing may include generating a model of aliasing artifacts in the compressed sensing data based on a noise level of the compressed sensing data and a sampling density of the compressed sensing data, denoising the compressed sensing data, the denoising based on the model, the sampling density, and the noise level of the compressed sensing data, and generating an updated image based on the compressed sensing data and the denoised image data. A result of the denoising may be denoised image data.

In a third aspect, a magnetic resonance compressed sensing image reconstruction system is provided. The system may include an image processor, coupled with a memory containing instructions. When executed, the instructions may cause the image processor to receive compressed sensing data generated by a magnetic resonance imager, generate a model of noise in the compressed sensing data based on a noise level of the compressed sensing data and a sampling density of the compressed sensing data, reconstruct the compressed sensing data into a medical image by denoising the compressed sensing data based on the model and by generating an updated image based on the compressed sensing data and the denoised image data, estimate an error of the denoised image data, update a denoising parameter based on the error of the denoised image, repeat the denoising based on the parameter when the error is above a threshold error, and output an output image based on the updated image. A result of the denoising may be denoised image data.

The present invention is defined by the following claims, and nothing in this section should be taken as a limitation on those claims. Further aspects and advantages of the invention are discussed below in conjunction with the preferred embodiments and may be later claimed independently or in combination.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION OF THE DRAWINGS AND PRESENTLY PREFERRED EMBODIMENTS

Figure 1:
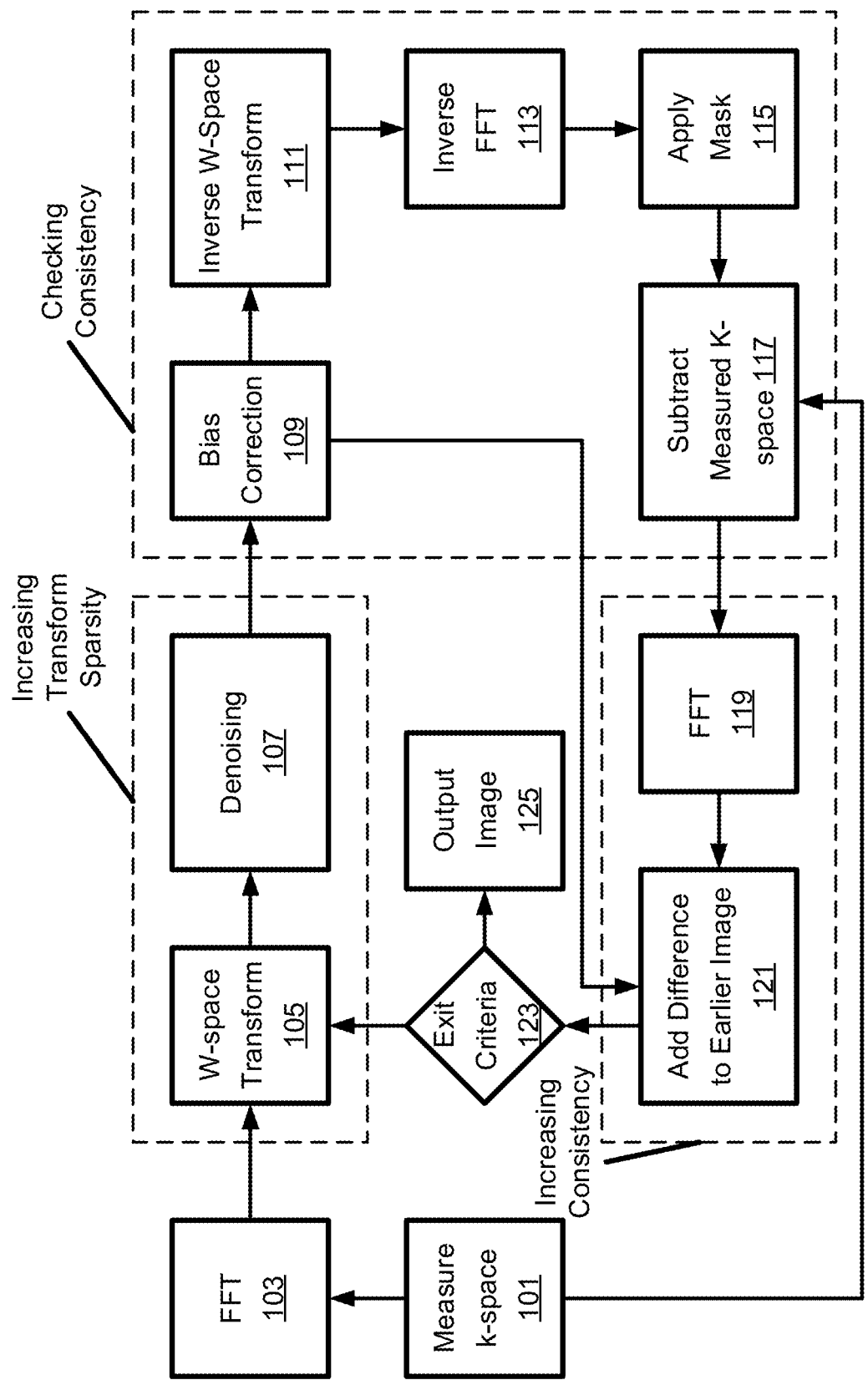
FIG. 1 illustrates one embodiment of a method of reconstructing an image using a colored noise model.

Compressed sensing is used for acquiring MR images because it reduces the time of acquiring measurements. In compressed sensing, undersampling may be performed using an incoherent sampling pattern that generates noise-like aliasing artifacts in the acquired MR data.

Though deep learning may be used to reconstruct MR images, deep learning systems are trained to perform well on reconstructing a specific dataset but do not generalize well to new applications that were not part of a training dataset. The incoherent undersampling present in compressed sensing presents another challenge as deep learning reconstruction systems are better suited to reconstructions involving structured artifacts such as temporal parallel acquisition technique (TPAT) undersampling or non-cartesian imaging.

In another reconstruction approach, the aliasing artifacts may be removed from the image data during reconstruction, for example, using a denoiser. The denoiser may effectively remove the aliasing artifacts if the distribution and intensity of the aliasing artifacts is modeled. A model of the aliasing artifacts may be generated based on the sampling density of the compressed sensing and a noise level of the compressed sensing data. A reconstruction process modeling the aliasing artifacts due to compressed sensing and removing the artifacts may improve the quality of the image resulting from reconstruction and the speed of the reconstruction process. As an alternative to deep learning-based reconstruction techniques, a reconstruction process that models the aliasing as noise and removes the aliasing artifacts during denoising may overcome the challenges faced by a deep learning reconstruction.

The aliasing artifacts may be modeled for each band of the k-space data. Removing the aliasing artifacts based on the model may require, for each band, tuning multiple parameters of the denoiser. Optimal denoising parameters may be specific to the undersampling pattern, coil sensitivities of coils of the MR imager, what part of a body is being scanned, and other factors. The denoising parameters may be manually tuned for optimal image quality. However, manual tuning may be time and resource intensive, and the denoising parameters tuned for reconstruction of one set of compressed sensing data and one denoiser may not be applicable to reconstructions of other image data, for example, generated using a different undersampling pattern, with different coils, and/or on other parts of the body using different denoisers. In other words, a denoiser manually optimized for one set of imaging conditions may not provide an adequate quality reconstruction under other imaging conditions.

Instead, the denoising parameters may be chosen, tuned, or updated based on minimizing an error introduced by the denoiser. Though the error (e.g. the difference between the denoised image and the ground truth) may not be directly calculable when the ground truth is not known, the error may be estimated. Minimizing the estimate of the error corresponds to minimizing the actual error. In this way, the denoising parameters may be automatically tuned without manual intervention. Because the tuning is automatic, a reconstruction and denoising technique based on error-minimization may be adaptable to different imaging conditions without manual retuning and may improve the efficiency of reconstruction and the quality of the reconstructed image.

FIG. 1 illustrates one embodiment of a method of reconstructing an image. Reconstruction in general is discussed with respect to FIG. 1. The use of a colored noise model in the denoising is described for act 107 in this reconstruction context. Though FIG. 1, as an example, reconstructs a two-dimensional (2D) image from 2D MR data, the acts of FIG. 1 may also apply to reconstruction of three-dimension or higher-dimension MR data. Image space, as used in the description, may also refer to object space. Pixels, as used in the description, may also refer to voxels.

More, fewer, or different acts may be performed. In some cases, act 125 may be omitted. The acts may be performed in a different order than shown. A processor coupled to a memory may be configured to perform one or more of the acts. For example, the image processor 603 of FIG. 6 may be configured to perform one or more of the acts of FIG. 1. The processor may be part of or in communication with a MR imaging device or system. For example, the MR imaging device may be the Magnetic Resonance Imager 609 of FIG. 6.

The reconstruction process may include three phases: a phase where the transform sparsity is increased, a consistency checking phase, and a consistency increasing phase. Other representations of the reconstruction process may be used.

In act 101, k-space data is acquired. A MR imaging device may scan an imaging volume and record k-space data. The k-space data may be a measurement of radiofrequency intensity in the imaging volume. However, locations in the k-space may not correspond to physical locations or pixels/voxels within the imaging volume.

For compressed sensing, the k-space data may be undersampled. In some cases, the undersampling may be incoherent, or random across the frequency domain. Additionally or alternatively, the sampling may be a Fourier sampling or occur over a subset of frequencies in the frequency domain. The energy of the MR measurements taken by the MR imaging device may be more concentrated in low frequencies than in high frequencies. For example, the undersampling may be performed over the lower frequencies but not the higher frequencies.

Noise in the k-space, for example, caused by reception coils or other measurement devices of the MR device, may be distributed over the entire frequency range. The undersampling may cause aliasing artifacts that are visible when the k-space measurements are transformed into an image or object space (e.g. in act 103). Where the undersampling is incoherent, the aliasing artifacts will be distributed like measurement noise and, therefore, can be removed like measurement noise (e.g. in act 107). As compared to white noise (or random or Gaussian noise), the aliasing artifacts due to compressed sensing look like colored noise. In some cases, the measurement noise may be determined with the acquisition of the k-space data. For example, a noise-only pre-scan may be performed. The measurement noise may be determined based on the noise-only pre-scan. The distribution and intensity of noise in the pre-scan may correspond to the distribution and intensity of measurement noise in the acquired k-space data. In some other cases, the measurement noise (and the sampling density) may be estimated based on the acquired k-space data.

In act 103, the k-space data is transformed into an image or object space. A Fourier transform may be used to turn the k-space data into an image. The image may represent an amplitude or intensity of electromagnetic response measured by the MR imager as distributed over two or three dimensions. The k-space data may be the measured k-space data (e.g. from act 101). On a first iteration, the image transformed from the measured k-space data may contain artifacts and noise. As a result, further refinement of the k-space data may be necessary to obtain a usable image.

In act 105, the image generated in act 103 is transformed into w-space. The transformation may be made using the wavelet transform (the w-transform). The output of the w-transform may be known as w-space data or the wavelet representation of the MR data. In w-space, the MR data may have increased sparsity than in image space or k-space. The increased sparsity of the w-space, e.g. where the signal is concentrated into fewer pixels while most pixels have only a lower intensity, may allow for easier separation of the signal from the noise in the MR data than in the image space.

In act 107, the w-space data is denoised. Noise in the w-space data may be due to both white (e.g. Gaussian) noise and noise due to aliasing artifacts from the compressed sensing. For the aliasing noise to be removed, the distribution of the noise over the w-space data may be determined.

A model of the aliasing noise may reveal where the aliasing noise is located across the w-space. With compressed sensing, the location or shape of the aliasing noise may be known because the MR data is more highly concentrated in a subset of (e.g. lower) frequencies; the aliasing may also be present in those frequencies, not evenly spread across the whole frequency spectrum, as would random or white (Gaussian) noise. Because reconstruction methods like vector approximate message passing (VAMP) assume that the noise present in the compressed sensing data is random and has the same energy distribution (e.g. the noise is spread across the frequency spectrum), such assumptions do not apply to compressed sensing where the MR measurements (and the aliasing artifacts) are concentrated within a subset of the frequency spectrum.

With incoherent undersampling across the k-space in compressed sensing, the MR aliasing "looks" like colored noise, not white, random, or Gaussian noise. For example, the sampling may be represented by or correspond to a vector of independent Bernoulli samplings across the frequency spectrum.

$$m_k \sim \text{Bernoulli}(p_k) \quad \text{Eq. 1}$$

In Equation 1, k represents the frequency index, p represents the sampling probability, or sampling density, at frequency k, Bernoulli refers to the Bernoulli probability distribution, and m represents the binary sampling mask resulting from drawing a random realization of the Bernoulli distribution according to the sampling probability p. Additionally or alternatively, the undersampling of the frequency spectrum may be represented as Fourier sampling according to the sampling probability p. The sampling density p may represent the extent to which the compressed sensing data is undersampled.

Because the undersampling is performed across the image spectrum, the spectrum of the aliasing may correspond to the sampling mask m. In this way, the aliasing spectrum may be modulated by both the image spectrum and the sampling density within that spectrum.

$$x_k = m_k(y_k + \varepsilon_k) \quad \text{Eq. 2}$$

In Equation 2, k is the frequency index, x is the measured data (e.g. in act 101), y is the true data (or the MR data uncorrupted by measurement noise or aliasing artifacts), and ε is a white Gaussian measurement noise with standard deviation σ.

The expected value of the measured data may depend on the sampling probability and the true signal.

$$E_m(x) = py \quad \text{Eq. 3}$$

In Equation 3, $E_m(x)$ represents the expected value of the MR k-space measurements applying the undersampling according to the sampling density m. To remove any bias in the k-space measurements x caused by undersampling, the measurements x can be divided by n. The noise present due to the aliasing artifacts may then be determined to be the difference between the measured data x and the true data y.

$$E_m(|p^{-1}x - y|^2) = \left(\frac{1-p}{p}\right)|y|^2 + \frac{1}{p}\sigma^2 = \left(\frac{1-p}{p^2}\right)E_m(|x|^2) + \sigma^2 \quad \text{Eq. 4}$$

In Equation 4, $E_m(|p^{-1}x-y|^2)$ is a variance of the expected value of the measured data as compared to the true signal y. In some cases, because MR data is likely to reside in lower frequencies, the sampling probability p may be chosen based on the frequency. For example, the sampling probability may be high in the lower frequencies and lower in the higher frequencies. The variance may be determined for each frequency, thereby giving a frequency-specific estimate of the variance of the acquired data. Together, the frequency-specific estimates of the variance may be a vector of the variances. Because the variance corresponds to the variance of the aliasing as well, Equation 4 may serve as a frequency-specific model of the aliasing noise.

However, Equation 4 only provides the expected energy (or intensity) of the aliasing artifacts with respect to the mask. In other words, Equation 4 does not provide an aliasing level that can be used for one single scan. This may be overcome by looking in w-space, a space resolved both in space and frequency. The w-domain may be a wavelet domain, a pyramidal decomposition or another space-frequency domain. In the w-domain, however, the energy of the noise in the w-space is a linear combination of the energy of the aliasing at all the sampled frequencies, weighted by the power spectrum of the convolution filter, W, applied to go from image space to w-space. Due to the Central Limit Theorem, which states that weighted sum of a large number of independent random variables is close to its expectation with high probability, the aliasing energy in w-space can be determined for each scan. The aliasing energy in the w-space may be determined from the noise level in the w-space and the power spectrum of the applied filter. Because both the energy of the noise in the w-space and the sampling probability (used in the mask, see, e.g. Equation 1) may be known, then the energy of the aliasing may be determined from only known quantities.

$$r = WF^{-1}p^{-1}x \approx WF^{-1}y + a, \quad \text{Eq. 5}$$
$$\text{where } a \sim N\left(0, |WF^{-1}|^2\left(\frac{1-p}{p^2}\right)|x|^2 + \sigma^2\right)$$

In Equation 5, F represents the Fourier transform, $WF^{-1}y$ represents the true image in w-space, r represents an unbiased estimator of the true image using only the available data, and a is the residual error of that estimator due to aliasing and measurement noise. This model represents the aliasing noise present in each band, or across multiple frequencies, in the w-space. Having a model of the aliasing noise, parameters of the noise may be determined. For example, the variance of the aliasing noise generally or per each frequency band may be determined. Where the w-transform is applied to multiple sub-bands, the noise level for each sub-band may be estimated. Taken together, a band-specific estimate of the energy spectrum of the aliasing noise may be determined.

One or more denoising techniques may be used to reduce the residual error. For example, the w-space data may be denoised using thresholding or combinations of low pass and high pass filters. Parameters of the denoiser may be chosen or refined such that the denoiser removes noise without introducing significant error into the result (e.g. by removing the measured signal along with the noise). The error may be defined as the mean squared error between the output of the denoiser and the underlying signal—if the output of the denoiser is significantly different from the underlying signal, then the denoiser has introduced significant error. In practice, the underlying signal may not be known a priori because reconstructing uses k-space measurements that include the signal mixed gaussian noise and aliasing artifacts from the compressed sensing.

With the noise level (due to aliasing) modeled for each sub-band in the w-space, the denoiser may remove a band-specific amount of noise from each band. Rather than manually tuning parameters of the denoiser or used predetermined values, the denoising parameters (e.g. corresponding to how much noise to remove from each band) may be chosen and tuned in order to minimize the error introduced by the denoiser.

The error introduced by the denoiser may be estimated, for example, using Stein's Unbiased risk Estimator (SURE). Because the value of SURE corresponds to or is equal to the error produced by the denoiser, parameters of the denoiser may be chosen, adjusted, or updated to minimize SURE, thereby minimizing the error introduced by the denoiser. Because the parameters may be chosen, adjusted, or updated based on SURE, the denoiser may be automatically tuned based on the signal and noise of the k-space measurements without any knowledge of the imaging environment (e.g. including what imaging device was used, which coils were used, and/or which part of the body was scanned).

SURE views the k-space measurements as a signal corrupted with Gaussian noise with mean zero and known variance represented by a sum of the noise and the underlying signal.

$$r = r_0 + \varepsilon, \quad \text{Eq. 6}$$

where $\varepsilon \sim \mathcal{N}(0, t)$

In Equation 6, r represents the signal corrupted with gaussian noise, ε, added to the underlying signal $r_0$. The noise has a mean of zero and a known variance, t. Reconstruction attempts to recover $r_0$ by applying a denoiser, g( ), to the signal r based on parameters of the noise variance, and free parameters of the denoiser λ. The performance of the denoiser may be determined based on an estimate of the error, or difference, between the output of the denoiser and the original signal $r_0$.

$$E(SURE) = E\left(\frac{1}{N}\|g(r, \lambda) - r_0\|^2\right) \quad \text{Eq. 7}$$

In Equation 7, E(SURE) is the expected value of an estimate of the error using Stein's Unbiased Risk Estimator, as applied to the right half of the equation, the expected value of the mean squared error between the result of the denoiser, g(r, λ), and the original signal $r_0$. N represents the number of measurements in the k-space. The result is that if the noise variance can be estimated, then SURE can be minimized to tune the denoising parameters because minimizing SURE corresponds to minimizing the mean squared error of the denoised signal.

For denoising via thresholding, all locations with an intensity lower than the threshold intensity are reduced to zero. The value of the threshold intensity may be chosen to minimize the expected value of SURE, as above. The value of the threshold may be subtracted from all other locations (e.g. those at or above the threshold).

For denoising using high pass and/or low pass filters, different denoising techniques may be applied per each frequency band in the w-space. For example, a Weiner filter may be applied to low pass bands, and a Garrote filter may be applied to the high pass bands. In some cases, the range of frequencies included in the high pass bands and the low pass bands may be determined based on an estimate of the error introduced by the denoiser. For example, Stein's Unbiased risk Estimator (SURE) may provide an estimate of the error, or mean square difference, between the output of the denoiser and the underlying signal (e.g. without noise) present in the k-space measurements. Choosing ranges of the high pass frequencies and the low pass frequencies that minimize SURE also minimize the error or difference between the output of the denoiser and the underlying signal present in the measured k-space data.

Regardless of whether thresholding, high/low-pass filtering, or another denoising technique is used, the denoising and tuning process may remain the same. A processor (e.g. the image processor 603 of FIG. 6, described below) may receive or use the w-space data. The processor may receive or determine a sampling density (e.g. from act 101 or the MR imager). In some cases, the sampling density may be a setting for the k-space measuring or otherwise a known parameter of the MR imaging. The processor may construct a model of the aliasing artifacts in the w-space data. For example, the processor may generate the model based on Equation 4 for each band of the w-space using a band-specific sampling density and a band-specific noise level of the w-space data. The processor may determine a variance of the aliasing artifacts based on the model of the aliasing artifacts. Once the model of the aliasing artifacts is generated, the denoiser may be applied to the w-space data to obtain denoised data. The denoising parameters may be tuned based on an error of the denoised image. For example, a processor may use Equation 7 and the variance of the aliasing artifacts to estimate the error of the denoised image. The processor may check the estimated noise level against a threshold or against a previous estimate of the error. When the estimated error exceeds a threshold error (or if the change between the current error estimate and the previous error estimate exceeds a threshold change) the processor may change one or more denoising parameters, denoise the w-space data using the changed denoising parameters, and check the error again. When the estimated error (or the change in error) is below the threshold, the processor may perform one or more of the acts of FIG. 1.

The result of denoising is that denoised w-space image data is obtained. Using SURE, the error of the denoised w-space image data may be determined. When the error is acceptable (e.g. at or below an error threshold), the reconstruction process may proceed. Where the error is unacceptable (e.g. at or above an error threshold), the denoising parameters may be adjusted or tuned, and denoising repeated with the adjusted denoising parameters. For example, for denoising using a thresholding technique that resulted in unacceptable error, the value of the threshold (overall or per-band) may be raised or lowered, and the denoising repeated with the raised or lowered threshold. Because the denoising has increased the number of pixels with a value of zero and reduced the number of pixels with a non-zero value, the thresholding has increased the sparsity of the data.

In act 109, the denoised w-space data is corrected for any bias introduced during the denoising. The correction ensures that the next reconstruction iteration produces an unbiased estimator of the true image in w-space and prevents the propagation of bias throughout reconstruction. The correction may be known as an Onsager correction. In some cases, the correction may be performed in each band, e.g. applied to the pixels in each band of the w-space. For example, the correction may be performed using the same method as in the Vector Approximate Message Passing algorithm in each band. The corrected denoised band q may be a weighted sum of the band before and after denoising. The weights may be determined based on the degrees of freedom a of the denoiser, defined as the mean over all pixels in the band of the derivative of the output denoised pixel with respect to the input noisy pixel. The degrees of freedom may also be known as the divergence, in analogy a similar quantity used in fluid mechanics. Mathematically equivalent weights may also be computed as the inverse of the noise variances before and after denoising. As a result of the bias correction, corrected w-space data is obtained.

$$\alpha = \mathrm{mean}(g'(r))$$
$$q = \frac{g(r) - \alpha r}{1 - \alpha}$$
Eq. 8

In act 111, the corrected w-space data (e.g. obtained from act 109) is transformed into the image domain. The inverse w-transform may be used to transform the w-space data. As a result of the transforming, a denoised image is obtained. The denoised image may have less noise in the image than the image generated by the Fourier transform in act 103. However, the denoising may have altered the content of the image, so the denoised image is compared for consistency with the original measurements taken by the MR device.

In act 113, the denoised image is transformed into the k-space. The inverse Fourier transform may be used to transform the denoised image into the k-space domain. As a result of the transforming, a k-space representation of the denoised image is obtained. By transforming into the k-space, the k-space representation of the denoised image may be compared to the original measurements taken by the MR device (e.g. in act 101) which are also in the k-space.

Since the denoised image was modified (e.g. during denoising in act 107), the k-space representation of the denoised image now contains information in all spatial frequencies. In other words, the k-space of the representation of the denoised image has a 'complete k-space' (all or substantially all locations in k-space have non-zero values), as opposed to the measured (subsampled) k-space (e.g. of act 101) which had only few non-zero values.

In act 115, a mask or filter is applied to the k-space representation of the denoised image. Because the undersampling in compressed sensing reduces the overall signal level of the k-space measurements, the k-space representation of the denoised image must be compensated for the sampling density to obtain an unbiased estimate of the image. In some cases, the mask or filter multiplies the intensity of pixels or locations in the k-space by the inverse of the sampling density. For example, dividing both sides of Equation 2 by m will compensate for the sampling density and result in an unbiased estimate of the image once transformed out of k-space and into the image domain. In this way, the mask or filter may act as a high pass filter: because the sampling density may be higher in lower frequency bands and lower in the higher frequency bands, multiplying by the inverse of the sampling density will have little effect on the lower frequency bands and a greater effect on the higher frequency bands. In some other cases, the mask or filter may set a value of pixels in the k-space located outside of the region where the compressed sensing measurements were generated (e.g. in act 101) as equal to zero. The result of applying the filter or mask is a compensated k-space representation of the denoised image. Once filtered or masked to the region in the k-space sampled by the imaging, the filtered or masked k-space representation of the denoised image can be compared to the measured k-space data (e.g. from act 101).

In act 117, a difference k-space is created by subtracting the compensated k-space representation of the denoised image (e.g. from act 115) from the measured k-space data (e.g. from act 101). The difference between the compensated k-space representation of the denoised image and the measured k-space data is the error, z, that the denoising added to the w-space data (e.g. in act 107). In some cases, the subtracting may be normalized by a difference between a noise level of the compensated k-space representation of the denoised image (or the noise level of the denoised image) and a noise level of the measured k-space data. As a result of the error present in the k-space representation of the denoised image, the denoised image may be less consistent with the information (e.g. features, structures) present in the measured k-space data. The error, difference, or residual between the masked or filtered k-space representation of the denoised image and the measured k-space data may be known as a difference k-space.

$$z = x - mFW^{-1}q$$
Eq. 9

In act 119, a Fourier transform is applied to the difference k-space (e.g. from act 117) multiplied by the inverse of the sampling density. As a result of applying the transform, a difference image is obtained. The difference image may represent the noise removed in the denoising step and may be used to correct the noise in the compressed sensing data.

In act 121, the difference image is added to the image obtained earlier in the iteration (e.g. from act 109). The addition of the difference image and the previous image may be normalized by a difference between a noise level of the difference image and a noise level of the previous image. For example, where the previous image is an image estimate generated from measured k-space data (e.g. in acts 101 and 103), the noise level of the previous image may be a noise level of the measured k-space data. The combination of the difference image and the previous image may be referred to as an updated image. The updated image may be checked to see if the exit conditions are met, for example, in act 123.

$$r = q + WF^{-1}p^{-1}z \approx WF^{-1}y + a,$$
$$\text{where } a \sim N\left(0, |WF^{-1}|^2\left(\frac{1-p}{p^2}\right)|z|^2 + \sigma^2\right)$$
Eq. 10

In act 123, the exit conditions for the reconstruction process are checked. The number of iterations may be one exit condition. For example, a predetermined number of iterations may be performed before the reconstruction process exits. One, five, ten, or another number of iterations may be performed. The number of iterations may depend on one or more factors. For example, where higher quality or lower noise images are required, the reconstructions process may have more iterations before exiting.

Another exit condition may be how different an updated image is from the image generated from just the k-space data. A small difference between the updated image and the original image estimate (e.g. before reconstruction and denoising), or between the current updated image and the last updated image created during the previous iteration, may indicate that the reconstruction process is not creating a large improvement in the image quality. A threshold difference may be predetermined. When the difference between the current updated image and the last updated image or the original image is below the threshold, the reconstruction may exit.

In act 125, the updated image may be output if one, one or more, or all of the exit conditions are met. The updated image may be output to a computer, such as a workstation, a server, or a cloud, for later retrieval or viewing on a display.

Figure 2:
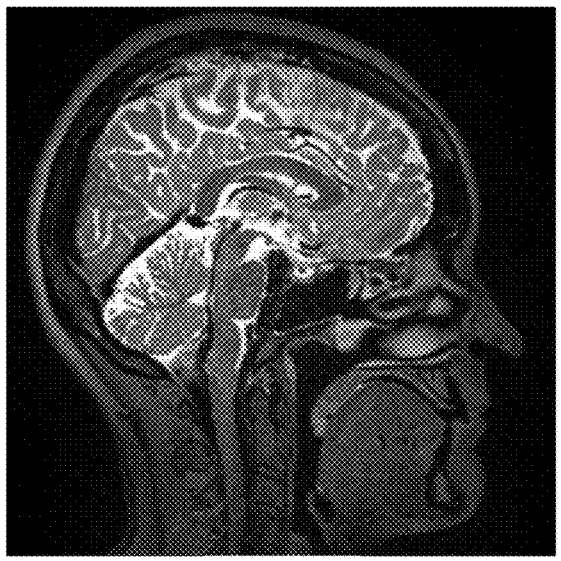
FIG. 2 illustrates compressed sensing data and aliasing artifacts.
Figure 2:
Figure 2:
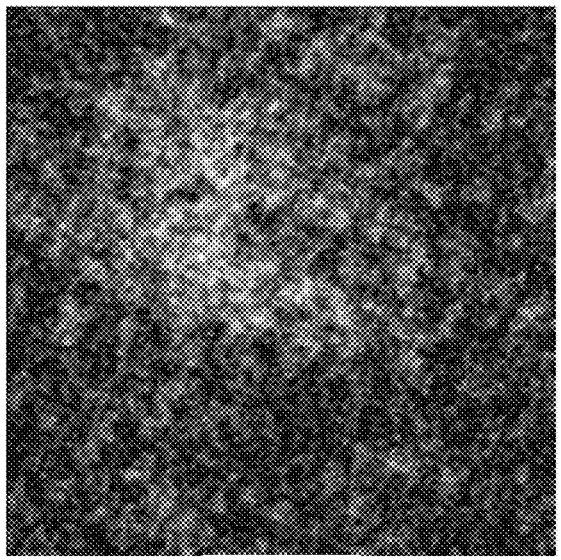
Figure 2:

FIG. 2 illustrates the compressed sensing data and the aliasing artifacts across four images 201, 203, 205, and 207. Image 201 shows a power spectrum of the ground truth magnetic resonance data. No undersampling or compressed sensing has been applied, and, therefore, no aliasing artifacts are present.

Image 203 shows a power spectrum of magnetic resonance data obtained by undersampling the ground truth of Image 201. This may correspond to the state of the image data acquired in act 101 of FIG. 1, before the denoising or other acts of the reconstruction process have been performed. Though some of the ground truth is visible in Image 203, the undersampling has added a haze or layer of noise over the ground truth. The layer of noise is the aliasing artifacts. Unlike white or random noise that would be spread over the image regardless of where the ground truth signal is located, the aliasing artifacts are concentrated in areas of the power spectrum where the ground truth signal is located. In this way, the aliasing artifacts look like colored noise and are different from white noise.

Image 205 shows the aliasing artifacts after subtracting the measured k-space from the denoised image (e.g. after act 117 of FIG. 1). The unstructured aliasing due to compressed sensing remains in the image after subtracting. The aliasing looks like low pass colored noise because the aliasing is modulated by the signal spectrum.

Image 207 shows the product of the sampling density and the signal spectrum. Because the aliasing is modulated by the signal spectrum and the sampling density, the product of the signal spectrum and the sampling density gives a texture that describes the texture of the aliasing. By modeling the aliasing using the signal spectrum and the sampling density, the aliasing can be removed during reconstruction (e.g. in act 107 of FIG. 1). For example, a threshold may be set with a threshold value chosen or determined to remove the aliasing as present in image 207.

Figure 3:
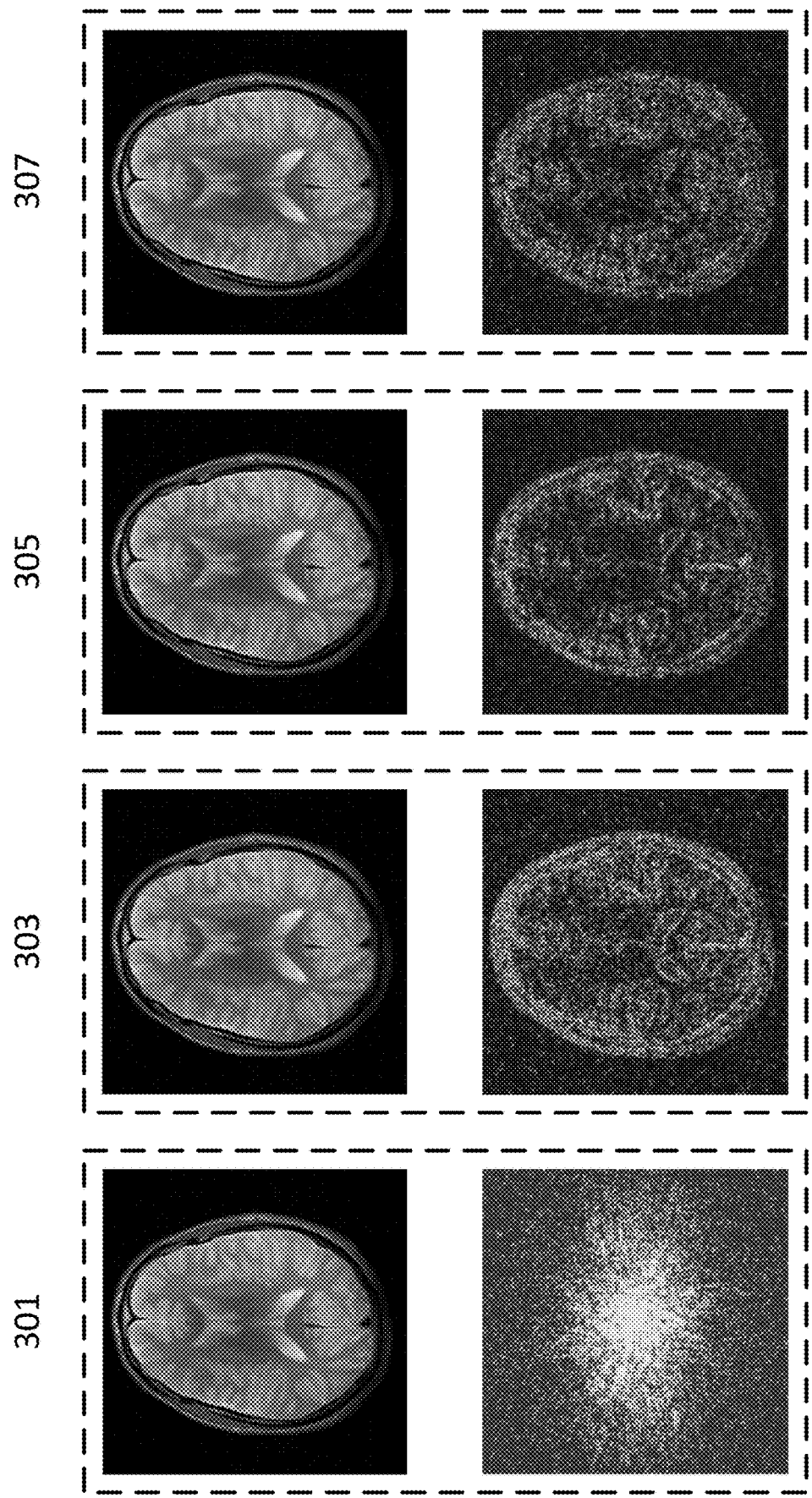
FIG. 3 illustrates a set of different reconstructions.

FIG. 3 shows a set of different reconstructions across four pairs of images 301, 303, 305, and 307. Pair 301 shows an image resulting from a reconstruction of fully sampled magnetic resonance imaging data. The magnetic resonance data was obtained using a single coil. Below the image is an undersampling pattern applied to the magnetic resonance data to form the undersampled compressed sensing data used as the basis for reconstructions of images 303, 305, and 307. The undersampling for 303, 305, and 307 was based on point sampling with an undersampling rate of 4.8.

Pair 303 shows an image reconstructed from compressed sensing data using an approximate message passing technique. A map of the error present in the reconstructed image is shown below. The denoising function in the reconstruction of 303 is soft thresholding. As opposed to the automatic and iterative denoiser parameter tuning described in FIG. 1, the reconstruction of 303 was performed using a thresholding parameter tuned by hand. The signal to noise ratio (SNR) of 303 is 34.1.

Pair 305 shows an image reconstructed from compressed sensing data using the method of FIG. 1. A map of the error present in the reconstructed image is shown below. The denoising function in the reconstruction of 305 is soft thresholding. The reconstruction of 305 was performed using a thresholding parameter tuned automatically by minimizing the value of SURE, as described above for act 107 of FIG. 1. The SNR of 305 is 36.2. Though the reconstruction in 305 used the same denoiser as in 303, a higher SNR was achieved by automatically tuning the thresholding parameter.

Pair 307 shows an image reconstructed from compressed sensing data using the method of FIG. 1. A map of the error present in the reconstructed image is shown below. The denoising function in the reconstruction of 307 is a Weiner filter applied on the low pass band and a Garrote filter applied on the high pass bands. The reconstruction of 305 was performed using a thresholding with a pass band demarcation parameter tuned automatically by minimizing the value of SURE, as described above for act 107 of FIG. 1. The SNR of 307 is 37.1. Though a different denoiser was applied in the reconstruction of 307, a high SNR was still achieved. Minimizing the value of SURE may allow for nearly any kind of denoiser to be tuned for a good reconstruction result.

Figure 4:
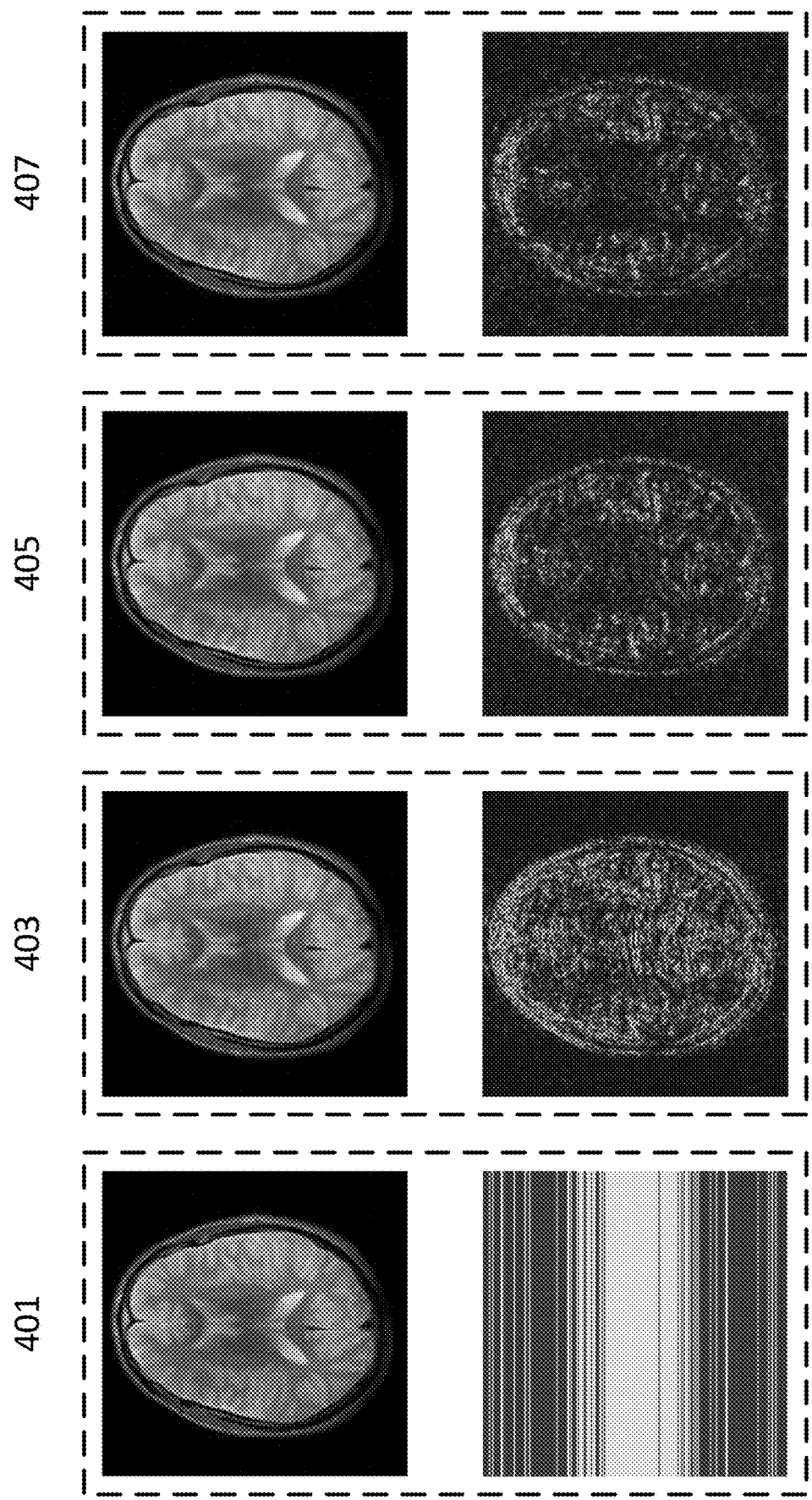
FIG. 4 illustrates another set of different reconstructions.

FIG. 4 shows a set of different reconstructions across four pairs of images 401, 403, 405, and 407. Pair 401 shows an image resulting from a reconstruction of fully sampled magnetic resonance imaging data. The magnetic resonance data was obtained using eight receive coils. Below the image is an undersampling pattern applied to the magnetic resonance data to form the undersampled compressed sensing data used as the basis for reconstructions 403, 405, and 407. The undersampling for 403, 405, and 407 was based on cartesian sampling with an undersampling rate of 2.5.

Pair 403 shows an image reconstructed from compressed sensing data using an approximate message passing technique. A map of the error present in the reconstructed image is shown below. The denoising function in the reconstruction of 403 is soft thresholding. As opposed to the automatic and iterative denoiser parameter tuning shown in FIG. 1, the reconstruction of 403 was performed using a thresholding parameter tuned by hand. The signal to noise ratio (SNR) of 403 is 34.3.

Pair 405 shows an image reconstructed from compressed sensing data using the method of FIG. 1. A map of the error present in the reconstructed image is shown below. The denoising function in the reconstruction of 405 is soft thresholding. The reconstruction of 405 was performed using a thresholding parameter tuned automatically by minimizing the value of SURE, as described above for act 107 of FIG. 1. The SNR of 405 is 36.8. Though the reconstruction in 405 used the same denoiser as in 403, a higher SNR was achieved by automatically tuning the thresholding parameter.

Pair 407 shows an image reconstructed from compressed sensing data using the method of FIG. 1. A map of the error present in the reconstructed image is shown below. The denoising function in the reconstruction of 407 is a Weiner filter applied on the low pass band and a Garrote filter applied on the high pass bands. The reconstruction of 305 was performed using a thresholding with a pass band demarcation parameter tuned automatically by minimizing the value of SURE, as described above for act 107 of FIG.

1. The SNR of 407 is 37.1. Though a different denoiser was applied in the reconstruction of 407, a high SNR was still achieved. Minimizing the value of SURE may allow for nearly any kind of denoiser to be tuned for a good reconstruction result. Though the number of coils and sampling pattern differed between 307 and 407 (FIGS. 3 and 4), a similar SNR was achieved in the end without manually tuning parameters. By using SURE to tune the denoising parameters, the reconstruction process of FIG. 1 may be automatically adaptable to different imaging and reconstruction environments.

Figure 5:
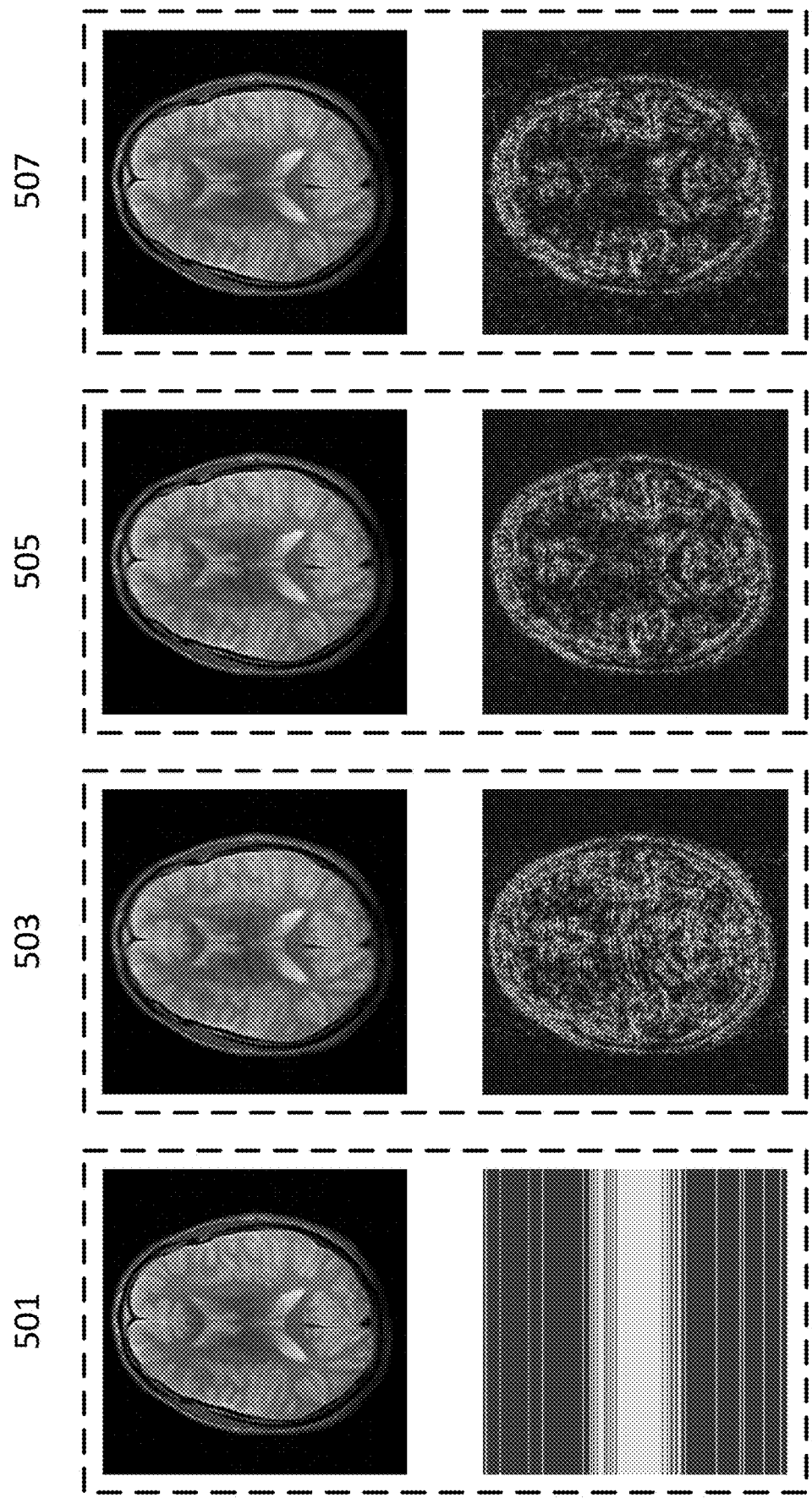
FIG. 5 illustrates a further set of different reconstructions.

FIG. 5 shows a set of different reconstructions across four pairs of images 501, 503, 505, and 507. Pair 501 shows an image resulting from a reconstruction of fully sampled magnetic resonance imaging data. The magnetic resonance data was obtained using eight receive coils. Below the image is an undersampling pattern applied to the magnetic resonance data to form the undersampled compressed sensing data used as the basis for reconstructions 503, 505, and 507. The undersampling for 503, 505, and 507 was based on cartesian sampling with an undersampling rate of 3.8.

Pair 503 shows an image reconstructed from compressed sensing data using an approximate message passing technique. A map of the error present in the reconstructed image is shown below. The denoising function in the reconstruction of 503 is soft thresholding. As opposed to the automatic and iterative denoiser parameter tuning shown in FIG. 1, the reconstruction of 503 was performed using a thresholding parameter tuned by hand. The signal to noise ratio (SNR) of 503 is 32.1.

Pair 505 shows an image reconstructed from compressed sensing data using the method of FIG. 1. A map of the error present in the reconstructed image is shown below. The denoising function in the reconstruction of 505 is soft thresholding. The reconstruction of 505 was performed using a thresholding parameter tuned automatically by minimizing the value of SURE, as described above for act 107 of FIG. 1. The SNR of 505 is 33.4. Though the reconstruction in 505 used the same denoiser as in 503, a higher SNR was achieved by automatically tuning the thresholding parameter.

Pair 507 shows an image reconstructed from compressed sensing data using the method of FIG. 1. A map of the error present in the reconstructed image is shown below. The denoising function in the reconstruction of 507 is a Weiner filter applied on the low pass band and a Garrote filter applied on the high pass bands. The reconstruction of 305 was performed using a thresholding with a pass band demarcation (threshold) parameter tuned automatically by minimizing the value of SURE, as described above for act 107 of FIG. 1. The SNR of 507 is 34.0. Though a different denoiser was applied in the reconstruction of 507, a high SNR was still achieved. Minimizing the value of SURE may allow for nearly any kind of denoiser to be tuned for a good reconstruction result.

Figure 6:
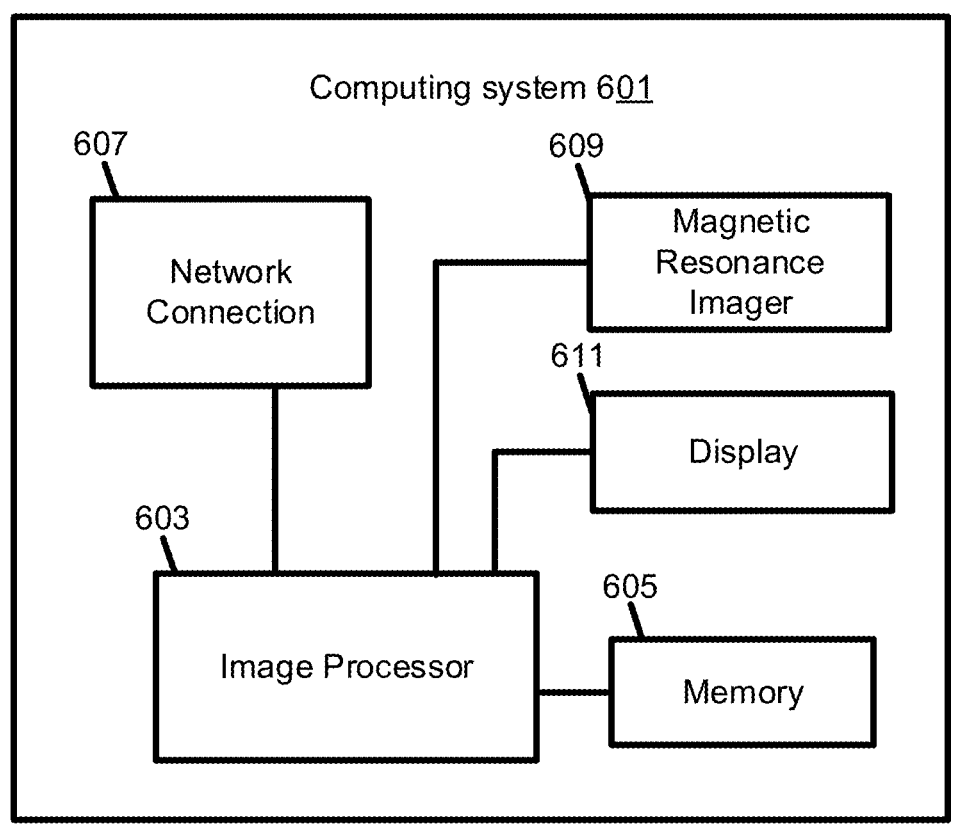
FIG. 6 is a block diagram of one embodiment of a system for reconstruction using a colored noise model for compressed sensing in MR.

FIG. 6 is a block diagram of one embodiment of a magnetic resonance compressed sensing image reconstruction system 601 for reconstructing magnetic resonance compressed sensing data. The computing system 601 may include an image processor 603 coupled with a memory 605 and in communication with a network connection 607, a magnetic resonance imager 609, and a display 611. The computing system 601 performs the acts of FIG. 1 or other acts.

The image processor 603 may be a general purpose or application specific processor. The image processor 603 may be configured to or may execute instructions that cause the image processor 603 to receive compressed sensing data generated by a magnetic resonance imager 609. In some cases, the compressed sensing data may be received via the network connection 607. For example, the image processor 603 may receive the compressed sensing data via the network connection 607 that was transmitted by a remote server or medical imager 609. In some other cases, the compressed sensing data may be received from the magnetic resonance imager 609 without being routed through the network connection 607. The image processor 603 may be part of the MR imager 609.

The image processor 603 may be configured to or may execute instructions that cause the processor to reconstruct the compressed sensing data into a medical image by denoising the compressed sensing data based on a noise level of the compressed sensing data and a sampling density of the compressed sensing data, where a result of the denoising is denoised image data and by generating an updated image based on the compressed sensing data and the denoised image data. Based on the updated image, the processor 601 may be configured to output an output image. In some cases, the output image may be transmitted to the display 611. In some other cases, the output image may be output to the memory 605, the network connection 607, and/or the magnetic resonance imager 609.

The memory 605 may be a non-transitory computer readable storage medium. The memory 605 may be configured to store instructions that cause the processor to perform an operation. For example, the memory 605 may store instructions that, when executed by the processor 601, cause the processor 601 to perform one or more acts of FIG. 1 or other acts. The memory 605 may be configured to store compressed sensing data, noise models, denoisers, denoising parameters, and other information related to executing the acts of FIG. 1 or other acts. The instructions for implementing the processes, methods, and/or techniques discussed herein are provided on non-transitory computer-readable storage media or memories, such as a cache, buffer, RAM, removable media, hard drive, or other computer readable storage media. Non-transitory computer readable storage media include various types of volatile and nonvolatile storage media.

The network connection 607 may receive compressed sensing data. The network connection 607 may be in communication with the processor 603, the memory 605, the magnetic resonance imager 609, and to computers, processor, and imagers external to the computing system 601. The network connection 607 may provide the compressed sensing data to the processor 603 and/or the memory 605 for storage, recall, and reconstruction.

The magnetic resonance imager 609 may generate compressed sensing data. For example, the magnetic resonance imager 609 may generate compressed sensing data of an object located in an imaging volume of the magnetic resonance imager 609. The magnetic resonance imager may be configured to perform one or more acts of FIG. 1. For example, the imager may be configured to perform act 101. Compressed sensing data generated by the magnetic resonance imager 609 may be stored in the memory 605 and reconstructed by the processor 603.

The display 611 may be configured to accept user input and to display audiovisual information to the user. In some cases, the display 611 may include a screen configured to present the audiovisual information. For example, the display 611 may present the output image of the reconstruction or one or more intermediate images from a reconstruction iteration. The display 611 may include a user input device.

In some cases, the user may input information relating to a particular denoiser to be used in reconstruction.

While the invention has been described above by reference to various embodiments, it should be understood that many changes and modifications can be made without departing from the scope of the invention. It is therefore intended that the foregoing detailed description be regarded as illustrative rather than limiting, and that it be understood that it is the following claims, including all equivalents, that are intended to define the spirit and scope of this invention.

We claim:

1. A method for reconstructing medical image data, the method comprising:
    acquiring, by a magnetic resonance imaging device, compressed sensing data;
    determining, by a processor, a sampling density of the compressed sensing data and a noise level of the compressed sensing data;
    transforming, by the processor, the compressed sensing data into an estimated image that is an unbiased estimator of a true image corrupted by noise-like aliasing;
    determining, by a processor, an intensity of the noise-like aliasing;
    denoising, by the processor, the compressed sensing data based on a noise model constructed from the sampling density of the compressed sensing data, the noise level of the compressed sensing data, and the intensity of the noise-like aliasing, where a result of the denoising is denoised image data;
    checking, by the processor, the denoised image data for consistency with the compressed sensing data, where a result of the checking is updated image data; and
    outputting, by the processor, an output image as a function of the updated image data.

2. The method of claim 1, wherein acquiring the compressed sensing data is based on incoherent under-sampling in k-space,
    wherein the sampling density varies in frequency, and
    wherein the compressed sensing data is k-space data.

3. The method of claim 2, wherein transforming the compressed sensing data into an estimated image comprises:
    multiplying, by the processor, the compressed sensing data by an inverse of the sampling density; and
    applying, by the processor an inverse Fourier transform to a product of the compressed sensing data and the inverse of the sampling density.

4. The method of claim 3, wherein the intensity of the noise-like aliasing is a variance of aliasing artifacts in the compressed sensing data.

5. The method of claim 4, wherein the variance is frequency-specific in the compressed sensing data.

6. The method of claim 1, further comprising:
    estimating, by the processor, an error of the denoised image data;
    updating, by the processor, a denoising parameter based on the error of the denoised image; and
    repeating, by the processor, the denoising based on the parameter when the error is above a threshold error.

7. The method of claim 6, wherein denoising comprises reducing, by the processor, an intensity of pixels in the compressed sensing data having an intensity below a threshold intensity, and
    wherein the threshold intensity is based on the denoising parameter.

8. The method of claim 6, wherein denoising comprises;
    applying, by the processor, a first filter to a first subset of frequencies of the compressed sensing data; and
    applying, by the processor, a second filter to a second subset of frequencies of the compressed sensing data, and
    wherein frequencies contained in the first subset or the second subset is based on the denoising parameter.

9. The method of claim 8, wherein the first filter is a Wiener filter, and
    wherein the second filter is a Garrote filter.

10. The method of claim 1, further comprising:
    repeating, by the processor, at least the denoising, transforming, and checking acts with the updated image data to obtain second updated image data;
    transforming, by the processor, the second updated image data into the image domain to obtain a second updated image; and
    outputting, by the processor, the output image as a function of the second updated image.

11. The method of claim 1, further comprising:
    applying, by the processor, an Onsager correction to the denoised image data, where a result of the Onsager correction is a corrected denoising image.

12. The method of claim 1, wherein checking the denoised image data for consistency further comprises:
    determining, by the processor, a difference between the compressed sensing data and a masked Fourier transform of the corrected denoising image, where a result of the determining is a k-space difference.

13. The method of claim 12, further comprising:
    multiplying, by the processor, the k-space difference by an inverse of the sampling density;
    applying, by the processor, an inverse Fourier transform to a product of the k-space difference and the inverse of the sampling density; and
    adding, by the processor, the Fourier transformed difference to the corrected denoised image, where a result of the adding is the updated image.

14. The method of claim 13, wherein the intensity of the noise-like aliasing in the updated image is determined based on the k-space difference, the sampling density, and a measure of measurement noise in the compressed sensing data.

15. A method of image reconstruction for compressed magnetic resonance data, the method comprising:
    acquiring, by a magnetic resonance imager, compressed sensing data;
    reconstructing, by a processor, the compressed sensing data into a medical image, the reconstructing comprising:
        generating, by the processor, a model of aliasing artifacts in the compressed sensing data based on a noise level of the compressed sensing data and a sampling density of the compressed sensing data;
        denoising, by the processor, the compressed sensing data, the denoising based on the model, the sampling density, and the noise level of the compressed sensing data, where a result of the denoising is denoised image data;
        generating, by the processor, an updated image based on the compressed sensing data and the denoised image data; and
    outputting, by the processor, an output image based on the updated image.

16. The method of claim 15, wherein the compressed sensing data is based on incoherent sampling in k-space according to the sampling density.

17. The method of claim 16, wherein the noise level of the compressed sensing data is a frequency-specific variance of aliasing artifacts in the model.

18. The method of claim 15, further comprising:
estimating, by the processor, an error of the denoised image data;
updating, by the processor, a denoising parameter based on the error of the denoised image; and
repeating, by the processor, the denoising based on the parameter when the error is beyond a threshold error.

19. The method of claim 18, wherein denoising comprises:
reducing, by the processor, an intensity of pixels in the compressed sensing data having an intensity below a threshold intensity, where the threshold intensity is based on the denoising parameter;
applying, by the processor, a first filter to a first subset of frequencies of the compressed sensing data; and
applying, by the processor, a second filter to a second subset of frequencies of the compressed sensing data, wherein frequencies contained in the first subset or the second subset are based on the denoising parameter.

20. A magnetic resonance compressed sensing image reconstruction system, the system comprising:
an image processor, coupled with a memory containing instructions that, when executed, cause the image processor to:
receive compressed sensing data generated by a magnetic resonance imager;
generate a model of noise in the compressed sensing data based on a noise level of the compressed sensing data and a sampling density of the compressed sensing data;
reconstruct the compressed sensing data into a medical image by denoising the compressed sensing data based on the model, where a result of the denoising is denoised image data and by generating an updated image based on the compressed sensing data and the denoised image data;
estimate an error of the denoised image data;
update a denoising parameter based on the error of the denoised image;
repeat the denoising based on the parameter when the error is above a threshold error; and
output an output image based on the updated image.

* * * * *